United States Patent [19]

Koike et al.

[11] Patent Number: 5,064,741

[45] Date of Patent: Nov. 12, 1991

[54] POSITIVE WORKING LIGHT-SENSITIVE COMPOSITION CONTAINING A FREE RADICAL GENERATOR AND A DISCOLORING AGENT

[75] Inventors: Akinobu Koike; Yukio Abe; Koichi Kawamura, all of Shizuoka, Japan

[73] Assignee: Fuji Photo Film Co., Ltd., Minami-Ashigara, Japan

[21] Appl. No.: 532,238

[22] Filed: Jun. 4, 1990

Related U.S. Application Data

[63] Continuation of Ser. No. 89,833, Aug. 27, 1987, abandoned.

[30] Foreign Application Priority Data

Aug. 29, 1986 [JP] Japan .................................. 61-202915

[51] Int. Cl.$^5$ .......................... G03C 1/52; G03C 5/00
[52] U.S. Cl. .................................. 430/191; 430/165; 430/192; 430/193; 430/270; 430/340; 430/343; 430/344; 430/920
[58] Field of Search ............... 430/920, 191, 192, 340, 430/343, 344, 270

[56] References Cited

U.S. PATENT DOCUMENTS

| | | | |
|---|---|---|---|
| 3,269,840 | 8/1966 | Pattyn et al. | 96/82 |
| 3,954,475 | 5/1976 | Bonham et al. | 96/67 |
| 4,160,671 | 7/1979 | Stahlhofen | 430/191 |
| 4,164,421 | 8/1979 | Shinozaki et al. | 430/191 |
| 4,258,123 | 3/1981 | Nagashima et al. | 430/281 |
| 4,399,211 | 8/1983 | Kondo et al. | 430/269 |
| 4,458,000 | 7/1984 | Stahlhofen | 430/191 |
| 4,481,276 | 11/1984 | Ishikawa et al. | 430/920 |
| 4,555,474 | 11/1985 | Kawamura et al. | 430/920 |
| 4,584,260 | 4/1986 | Iwasaki et al. | 430/920 |
| 4,594,310 | 6/1986 | Nagasaka | 430/920 |
| 4,619,998 | 10/1986 | Buhr | 544/193.1 |
| 4,837,128 | 6/1989 | Kawamura et al. | 430/281 |

FOREIGN PATENT DOCUMENTS 0271195 6/1988 European Pat. Off. .
1602903 11/1981 United Kingdom ............... 430/920

Primary Examiner—Charles L. Bowers, Jr.
Assistant Examiner—Christopher G. Young
Attorney, Agent, or Firm—Burns, Doane, Swecker & Mathis

[57] ABSTRACT

A light-sensitive composition is herein disclosed, which comprises at least one free radical generator represented by the following general formula:

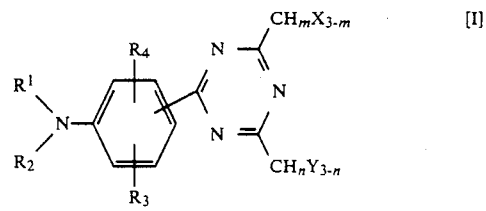

and at least one discoloring agent which interacts with products generated through the photolytic degradation of the free radical generator to change the color tone of the composition. The composition has a high stability with time and a good printing out property and therefore it can be used in making light-sensitive layer of PS plates, photoresists, proof plates for printing and films for overhead projector, intermediate print and photomask having high sensitivity long shelf life.

17 Claims, No Drawings

POSITIVE WORKING LIGHT-SENSITIVE COMPOSITION CONTAINING A FREE RADICAL GENERATOR AND A DISCOLORING AGENT

This application is a continuation of application Ser. No. 089,833, filed Aug. 27, 1987, abandoned.

BACKGROUND OF THE INVENTION

1. Field of the Invention

The present invention relates to a light-sensitive composition including new compounds capable of generating free radicals when they are irradiated with light and more particularly to a light-sensitive composition containing 4,6-bis(halomethyl)-s-triazines as a free radical generator.

2. Description of the Prior Art

Compounds which generate free radicals when they are irradiated with light (free radical generator) have been well known in the field of graphic art. These compounds have widely been used as a photopolymerization initiator in photopolymerizable compositions, as a photoactivator in free radical photographic compositions and as a photoinitiator in the reactions which are catalized with acids generated by irradiating the initiator with light. With the use of such a free radical generator, there has been produced a variety of light-sensitive materials useful in the image forming systems for printing, reproduction, duplication or the like.

Organic halogen compounds causes photolytic degradation to form free radicals of halogen such as chlorine free radicals and bromine free radicals. These free radicals of halogen serve as a good hydrogen atom extracting agent and form acids if a hydrogen donor coexists therewith. These photopolymerization processes and the application thereof to the free radical photographic processes are disclosed in the article of J. Kosar (Light Sensitive System, J. Wiley & Sons, New York, 1965, pp. 180–181 and pp. 361–370).

Typical examples of compounds which can generate free radicals of halogen by the action of light and have conventionally been known are carbon tetrachloride, iodoform and tribromoacetophenone and these compounds have widely been utilized in the aforementioned fields. However, these free radical generators cause sublimation and give out a bad smell and therefore, the use thereof leads to the reduction of its effect because of their sublimation during producing, using and storing the light-sensitive materials and the sublimation is detrimental to health. Moreover, they are incomplete in the compatibility with other components incorporated in a light-sensitive layer. Furthermore, they are less sensitive to photolytic degradation with light from a light source such as metal halide lamps commonly used in producing, for instant, a lithographic printing plate and therefore, it is required to incorporate a large amount thereof into the light-sensitive layer in order to attain a sufficient effect. Thus, it is common that the use of a large amount of these compounds exerts a great influence on mechanical properties and development properties of the light-sensitive layer containing the same.

Under such circumstances, there has been proposed the use of vinyl-halomethyl-s-triazine (U.S. Pat. Nos. 3,954,475 and 3,987,037 and Japanese Patent Unexamined Published Application, hereunder referred to as —J.P. KOKAI—, No. 48-36281); and halomethyl-s-triazine compounds (J.P. KOKAI Nos. 53-133428 and 55-32070). These s-triazine compounds surely have excellent properties such as extremely high sensitivity to photolytic degradation with ultraviolet light commonly used and high stability with time. However, when these compounds are used as a component of, for instance, light-sensitive compositions for presensitized plates for use in making lithographic printing plates (hereunder referred to as PS plate(s) for simplicity), a part of the light-sensitive composition existing in non-image areas even after development is liable to remain. In particular, if the development is carried out by rubbing the light-sensitive layer with adsorbent wadding or sponge containing developing liquid, the light-sensitive composition partially remains in non-image areas, which results in the bad appearance because of nonuniform development and leads to the generation of scumming when the resultant product is used as a lithographic printing plate.

SUMMARY OF THE INVENTION

As seen from the foregoing discussions, the conventional compounds capable of generating free radicals by the action of light are still incomplete in properties required to form an excellent light-sensitive composition for use in preparing practically acceptable light-sensitive layer.

Accordingly, it is a principal purpose of the present invention to provide a light-sensitive composition having an excellent printing out property, i.e., a light-sensitive composition capable of providing visually recognizable contrast between image areas and non-image areas immediately after exposure to light.

It is another purpose of the present invention to provide a light-sensitive composition which seldom remains in non-image areas after exposure to light and capable of providing lithographic printing plates free from scumming when it is used in the light-sensitive layer of a PS plate.

It is a further purpose of the present invention to provide a light-sensitive composition having a good stability with time, in other words, a light-sensitive composition capable of maintaining the properties observed immediately after the production thereof even after the storage for a long period of time.

It is still another purpose of the present invention to provide a light-sensitive composition highly sensitive to ultraviolet light from light sources commonly used in developing light-sensitive materials.

It is a still further purpose of the present invention to provide a light-sensitive composition excellent in physical properties and development property.

The other purposes of the present invention will be apparent from the explanation given below.

The aforementioned purposes of the present invention can effectively be accomplished by providing a light-sensitive composition which comprises at least one free radical generator represented by the following general formula (I) and at least one discoloring agent which interacts with products generated through the photolytic degradation of the free radical generator to change the color tone thereof:

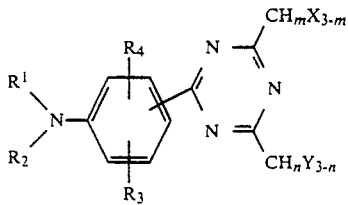 [I]

wherein $R_1$ and $R_2$ may be the same or different and represent hydrogen atom, a substituted or unsubstituted alkyl group, a substituted or unsubstituted aryl group, or a group represented by the following general formula (II) or (III):

 [II]

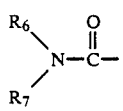 [III]

(in the general formula (II) or (III), $R_5$ represents a substituted or unsubstituted alkyl group, or a substituted or unsubstituted aryl group; and $R_6$ and $R_7$ may be the same or different, and represent hydrogen atom, a substituted or unsubstituted alkyl group or a substituted or unsubstituted aryl group); or $R_1$ and $R_2$ may form a heterocyclic group consisting of non-metallic atoms together with the nitrogen atom to which they are bonded; $R_3$ and $R_4$ represent hydrogen atom, a halogen atom, an alkyl group or an alkoxy group; X and Y may be the same or different and represent chlorine atom or bromine atom; and m and n are an integer of 0, 1 or 2.

In $R_1$ to $R_7$, preferred examples of the substituted and unsubstituted alkyl group are those having 1 to 6 carbon atoms such as methyl, ethyl and iso-propyl groups and preferred substituted and unsubstituted aryl groups include those having 6 to 14 carbon atoms such as phenyl and naphthyl groups.

In $R_1$, $R_2$ and $R_5$ to $R_7$, examples of the substituents attached to the alkyl and aryl groups are aryl groups such as phenyl group, halogen atoms such as chlorine atom, alkoxy groups such as methoxy and ethoxy groups, carboxyl group, carboalkoxy groups such as carbomethoxy and carboethoxy groups, carboaryloxy groups, cyano group, acyl groups such as acetyl and benzoyl groups, nitro group, dialkylamino groups, or groups derived from sulfonyl such as those represented by the following general formula (A), (B) or (C):

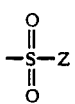 (A)

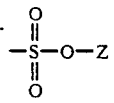 (B)

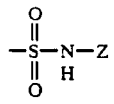 (C)

wherein Z represents hydrogen atom, an alkyl group or an aryl group).

In addition to the foregoing substituents listed above, the substituted aryl group appearing in $R_1$, $R_2$ and $R_5$ to $R_7$ may be substituted with alkyl groups.

Examples of the haterocyclic group formed $R_1$ and $R_2$ together with the nitrogen atom to which they are bonded include those represented by the following formulas (D) to (H).

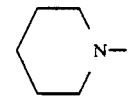 (D)

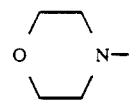 (E)

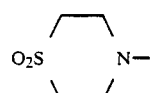 (F)

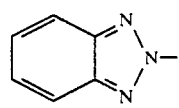 (G)

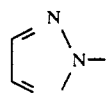 (H)

Particularly preferred examples of the substituents attached to the substituted alkyl and aryl groups of $R_1$ and $R_2$ are electron attractive groups such as halogen atoms, carboxyl group, carboalkoxy groups, cyano group, acyl groups, and groups derived from sulfonyl, and particularly preferred examples of the substituents attached to the substituted alkyl and aryl groups in $R_5$ are electron donative groups such as dialkylamino and alkoxy groups.

The compounds represented by the general formula (I) which may be used in the light-sensitive composition of the present invention may be synthesized by cyclizing an aromatic nitrile compound represented by the following general formula (IV):

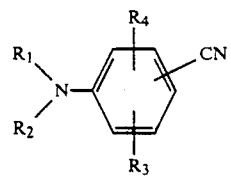 [IV]

wherein $R_1$ to $R_4$ have the same meanings as those defined in connection with the general formula (I), and a haloacetonitrile according to the method developed by K. Wakabayashi et al. disclosed in Bull, Chem. Soc., Japan, 1960, Vol. 42, pp. 2924-2930.

The examples of the compounds represented by the general formula (I) useful in the light-sensitive composition of the present invention will hereunder be listed, however, it should be appreciated that the present invention is not restricted to these specific examples.

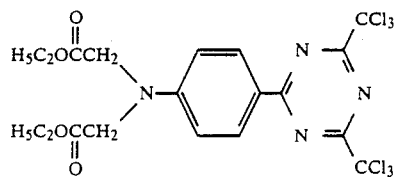 (1)

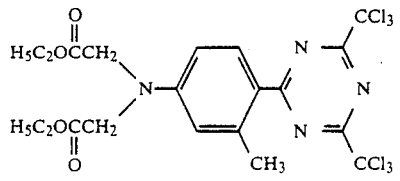 (2)

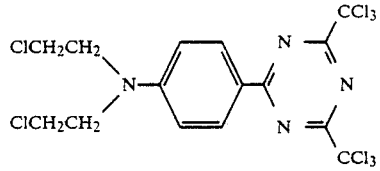 (3)

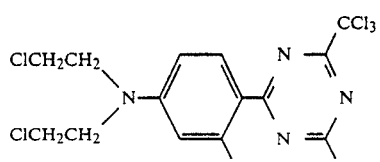 (4)

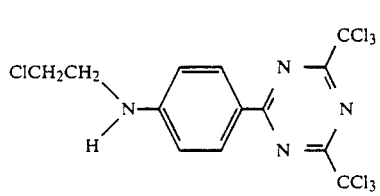 (5)

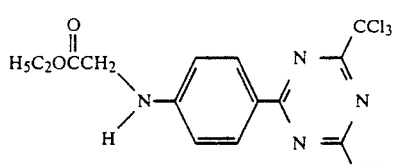 (6)

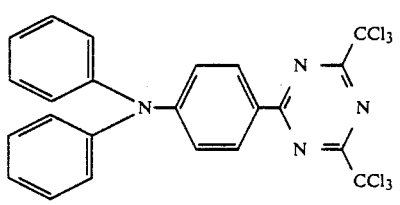 (7)

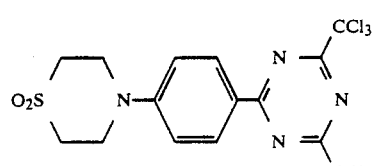 (8)

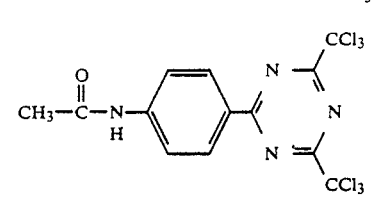 (9)

-continued

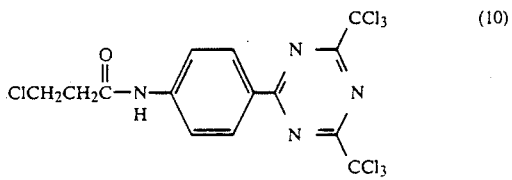 (10)

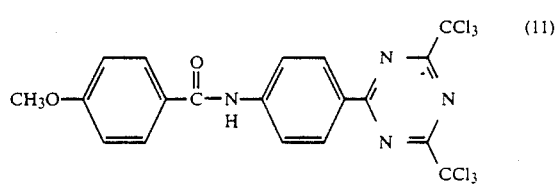 (11)

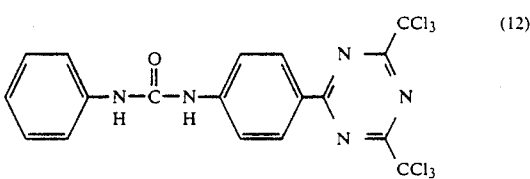 (12)

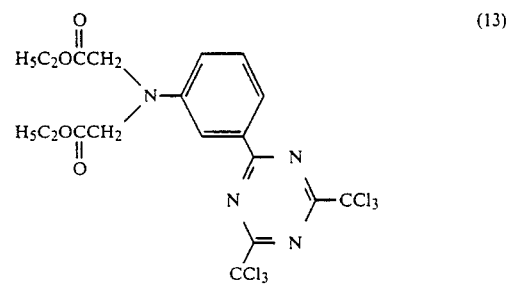 (13)

EXAMPLE OF PREPARATION

Synthesis of 4-(P-N,N-di(ethoxycarbonylmethyl)-aminophenyl)-2,6-di-(trichloromethyl)-s-triazine (compound (1))

4.35 g of P-N,N-di-(ethoxycarbonylmethyl)aminobenzonitrile, 13 g of trichloroacetonitrile and 0.4 g of aluminum tribromide were mixed together while stirring and hydrogen chloride gas was introduced thereinto at 5° C. for 1 hour. The temperature was raised up to room temperature and stirring was continued for 20 hours. The reaction solution was extracted with methylene chloride and methylene chloride was evaporated off under reduced pressure after washing the extract with water. The residue was subjected to column chromatography using hexane-ethyl acetate (2:1 v/v) as the eluent and the elute was concentrated to obtain 4 g of the title compound in the form of crystal. M.P.=109–111° C.

U.V. spectrum (in tetrahydrofuran)
$\lambda_{max}$=386 nm (log $\epsilon$=457)
I.R. spectrum (cm$^{-1}$): 1735, 1545, 1410, 1200.

The compounds represented by the general formula (I) as used herein are useful to impart properties for establishing visually recognizable contrast between image areas and non-image areas immediately after exposure to light without development (hereunder referred to as—printing out property—for simplicity) to the light-sensitive compositions for producing PS plates, print-circuit boards for IC, photomasks and the like. The light-sensitive composition having such printing out property provides visible images by simply irradiating it with light under yellow safelight. Therefore, it is possible to determine whether a given plate is exposed or not, for instance, if a plurality of PS plates are simultaneously exposed to light and such operation is interrupted. At the same time, when a large PS plate is repeatedly subjected to exposure to light, for instance, in the case of the so-called composer printing method used for making lithographic printing plates, the operator can easily confirm which portions thereof have been exposed to light.

The compositions for imparting such a printing out property to the light-sensitive compositions (hereunder referred to as printing out composition) comprises at least one free radical generator and at least one discoloring agent which causes interaction with products formed by the photolytic degradation of the free radical generator such as those already mentioned above. According to the present invention, the compounds represented by the general formula (I) are used as the free radical generator in such a printing out composition.

The discoloring agents as used herein can roughly be classified into two groups, one of which is originally colorless and develops a color by the influence of the photolytic products of the free radical generator represented by the general formula (I), the other of which has an inherent color respectively and changes the color or causes decoloring due to the interaction with such photolytic products.

Examples of the former include arylamines and preferred are simple arylamine such as primary and secondary aromatic amines as well as so-called leuro dyes. Concrete examples thereof include diphenylamine, dibenzylaniline, triphenylamine, diethylaniline, diphenyl-p-phenylenediamine, p-toluidine, 4,4'-biphenyldiamine, o-chloroaniline, o-bromoaniline, 4-chloro-o-phenylenediamine, o-bromo-N,N-dimethylaniline, 1,2,3-triphenylguanidine, naphthylamine, diaminodiphenylme thane, aniline, 2,5-dichloroaniline, N-methyldiphenylamine, o-toluidine, p,p'-tetramethyldiaminodiphenylmethane, N,N-dimethyl-p-phenylenediamine, 1,2-dianilinoethylene, p,p',p''-hexamethyltriaminotriphenylmethane, p,p'-tetramethyldiaminotriphenylmethane, p,p'-tetramethyldiaminodiphenylmethylimine, p,p',p''-triamino-o-methyltriphenylmethane, p,p',p''-triaminotriphenylcarbinol, p,p'-tetramethylaminodiphenyl-4-anilinonaphthylmethane, p,p',p''-triaminotriphenylmethane and p,p',p''-hexapropyltriaminotriphenylmethane.

In addition, the effective discoloring agents which have inherent colors respectively and change the color or cause decoloring by the action of the products formed due to photolytic decomposition of the free radical generator include, for instance, different kinds of dyes such as diphenylmethane type, triphenylmethane type, thiazine type, oxazine type, xanthene type, anthraquinone type, iminonaphthoquinone type, azomethine type and azo type ones. Examples of such dyes are Brilliant Blue, eosine, Ethyl Violet, Erythrosine B, Methyl Green, Crystal Violet, Basic Fuchsine, phenolphthalein, 1,3-diphenyltriazine, Alizarin Red S, Thymolphthalein, Methyl Violet 2B, Quinaldine Red, Rose Bengale, Metanil Yellow, Thymolsulfophthalein , Xylenol Blue, Methyl Orange, Orange IV, diphenyl thiocarbazone, 2,7-dichlorofluorescein, Para Methyl Red, Congo Red, Benzopurpurine 4B, alpha-Naphthyl Red, Nile Blue 2B, Nile Blue A, Phenacetaline, Methyl Violet, Malachite Green, Para Fuchsine, Oil Blue #603 (ORIENT CHEMICAL INDUSTRIES LTD.), Oil Pink #312 (ORIENT CHEMICAL INDUSTRIES LTD.), Oil Red 5B (ORIENT CHEMICAL INDUSTRIES LTD.), Oil Scarlet #308 (ORIENT CHEMICAL INDUSTRIES LTD.), Oil Red OG ORIENT CHEMICAL INDUSTRIES LTD.), Oil Green #502 (ORIENT CHEMICAL INDUSTRIES LTD.), Spiron Red BEH Special (HODOGAYA CHEMICAL CO., LTD.), Victoria Pure Blue BOH (HODOGAYA CHEMICAL CO., LTD.), m-cresol purple, Cresol Red, Rhodamine B, Rhodamine 6G, Fast Acid Violet R, Sulforhodamine B, auramine, 4-p-diethylaminophenyliminonaphthoquinone, 2-carboxyanilino-4-p-diethylaminophenyliminonaphthoquinone, 2-carbostearylamino-4-p-dihydroxyethyl-amino-phenyliminonaphthoquinone, p-methoxybenzoyl-p'-diethylamino-o'-methylphenylimino-acetoanilide, cyano-p-diethylaminophenyliminoacetoanilide, 1-phenyl-3-methyl-4-p-diethylaminophenylimino-5-pyrazolone, 1-beta-naphthyl-4-p-diethylaminophenylimino-5-pyrazolone, 2,4-dinitro-5-chloro-2'-acetamino-4'-diethylamino-5'-methoxyazobenzene.

The compounds represented by the general formula (I) have a high stability with time in the printing out composition of the present invention, however, among the compounds used as the discoloring agents, leuco triphenylmethane type dyes in general tend to undergo oxidation. For this reason, it is effective to use a certain stabilizer in combination therewith, when such dyes are utilized.

Examples of such stabilizers effective to suppress the oxidation include amines, zinc oxide and phenols such as those disclosed in U.S. Pat. No. 3,042,575; sulfide compounds such as those disclosed in U.S. Pat. No. 3,042,516; alkaline metal iodides and organic acids disclosed in U.S. Pat. No. 3,042,518; anhydrous organic acids disclosed in U.S. Pat. No. 3,082,086; and triaryl compounds of antimony, arsenide, bismuth and phosphorus disclosed in U.S. Pat. No. 3,377,167.

In the composition of the present invention, the amount of the free radical generators represented by the general formula (I) incorporated therein ranges from about 0.01 to about 100 parts by weight, more preferably from 0.1 to 0 parts by weight, most preferably from 0.5 to 5 parts by weight per 1 part by weight of the discoloring agent.

On the other hand, the light-sensitive composition comprising the free radical generator of the general formula (I) and the discoloring agent which interacts with the products formed by photolytic degradation of the free radical generator to change the color tone of the composition may be used as the light-sensitive layer of the printing out light-sensitive materials as well as they may be incorporated into compositions for forming resist to impart; the printing out property thereto. The composition for forming resist into which the printing out composition is incorporated may be any conventional ones. Particularly preferred results can be obtained by the use of the compositions provided that the solubility thereof in alkaline aqueous solution is increased by irradiating it with light. Examples of such preferred positive light-sensitive compositions include (1) compositions comprising o-quinonediazide compound and (2) compositions comprising a compound which generates an acid through exposure to light and a compound having at least one bond which can be cleaved with the acid generated. These preferred compositions will hereunder be explained in more detail.

(1) Composition comprising o-quinonediazide compound

Particularly preferred o-quinonediazide compounds are disclosed in a variety of publications such as U.S. Pat. Nos. 2,766,118; 2,767,092; 2,772,972; 2,859,112; 2,907,665; 3,046,110; 3,046,111; 3,046,115; 3,046,118; 3,046,119; 3,046,120; 3,046,121; 3,046,122; 3,046,123; 3,061,430; 3,102,809; 3,106,465; 3,635,709; and 3,647,443 and compositions containing these compounds can effectively be utilized in the present invention to form the printing out compositions. Among them, particularly preferred compounds are o-quinonediazide sulfonates or o-naphthoquinonediazide carboxylates of aromatic hydroxyl compounds and o-naphthoquinonediazide sulfonic acid amides or o-naphthoquinonediazide carboxylic acid amides of aromatic amine compounds; and particularly products obtained through an esterification reaction between a condensate of pyrogallol and acetone and o-naphthoquinonediazide sulfonic acid disclosed in U.S. Pat. No. 3,635,709, products produced by the esterification reaction between a polyester having hydroxyl groups at the terminals and o-naphthoquinonediazide sulfonic acid or o-naphthoquinonediazide carboxylic acid disclosed in U.S. Pat. No. 4,028,111; products obtained by the esterification reaction between a homopolymer of p-hydroxystyrene or a copolymer of p-hydroxystyrene and other copolymerizable monomers and o-naphthoquinonediazide sulfonic acid or o-naphthoquinonediazide carboxylic acid disclosed in British Patent No. 1,494,043; and amido products obtained by reacting a copolymer of p-aminostyrene and other copolymerizable monomers with o-naphthoquinonediazide sulfonic acid or o-naphthoquinonediazide carboxylic acid provide quite excellent printing out compositions.

It is preferred to use these o-quinonediazide compounds in combination with an alkali-soluble resin. Examples of such alkali-soluble resins include novolak type phenol resins such as phenol-formaldehyde resin, o-cresolformaldehyde resin and m-cresol-formaldehyde resin. It is further preferred to use the foregoing phenol resins together with phenol substitute with alkyl groups having 3 to 8 carbon atoms such as tert-butylphenol-formaldehyde resin or a condensate of cresol with formaldehyde (see J.P. KOKAI No. 50-125806). These alkali-soluble resins are used in an amount of about 50 to about 85% by weight on the basis of the total weight of the o-quinonediazide compound and the alkali-soluble resins, and particularly preferred amount thereof is 60 to 80% by weight.

In the compositions comprising o-quinonediazide compounds, cyclic acid anhydride may be added for the purpose of enhancing the sensitivity thereof. Examples thereof are phthalic acid anhydride, tetrahydrophthalic acid anhydride, hexahydrophthalic acid anhydride, 3,6-endoxy- Δ-tetrahydrophthalic acid anhydride, tetrachlorophthalic acid anhydride, maleic acid anhydride, chloromaleic acid anhydride, alpha-phenylmaleic acid anhydride, succinic acid anhydride and pyromellitic acid anhydride as described in U.S. Pat. No. 4,115,128. The sensitivity of the composition may be increased up to about 3 times by the addition of 1 to 15% by weight of these cyclic acid anhydrides on the basis of the total weight of the composition.

(2) Composition comprising a compound which generates acids by irradiating it with light and a compound having at least one bond which can be cleaved with the acids generated There have been known a lot of compounds or mixtures which form acids by exposure to light and suitable examples thereof are diazonium, phosphonium, sulfonium and iodonium salts; organic halogen compounds; o-quinonediazide sulfonyl chloride; and the combination of an organometal and an organic halogen compound It is also suitable to use compounds which generate acids through photolytic degradation, as described in U.S. Pat. No. 3,779,778 and German Patent No. 2,610,842. The compounds represented by the general formula (I) are of course useful.

On the other hand, preferred compounds having at least one bond capable of being cleaved with acids are those having at least one C—O—C bond or those having at least one silyl ether group represented by the formula: C—O—Si. Examples of the former are acetal or O,N-acetal compounds disclosed in U.S. Pat. No. 3,779,778; or thoesters or amidoacetal compounds disclosed in U.S. Pat. No 4,101,323; polymers containing acetal or ketal groups in the main chain disclosed in U.S. Pat. No. 4,247,611; enol ether compounds disclosed in U.S. Pat. No. 4,248,957; N-acyliminocarbonate compounds disclosed in U.S. Pat. No. 4,250,247, and polymers having orthoester groups in the main chain described in U.S. Pat. No. 4,311,782. In addition, examples of the latter are silyl ether compounds described in J.P. KOKAI No. 60-37549.

The mixture ratio of the compound capable of generating acids by exposure to light to the compound having at least one bond capable of being cleaved with the action of acids ranges from 0.01:1 to 2:1 (weight ratio), preferably 0.2:1 to 1:1.

Such a composition is preferably used in combination with an alkali-soluble resin and preferred examples thereof include novolak type phenol resins such as phenol-formaldehyde resin, o-cresol-formaldehyde resin and m-cresol-formaldehyde resin.

The composition comprising the compounds represented by the general formula (I) and the discoloring agent according to the present invention for forming resists may further comprises pigments or dyes which do not serve as a discoloring agent, free radical generators other than those represented by the general formula (I) and other additives such as plasticizers according to need.

For example, the composition may include 2-halomethyl-1,3,4-oxadiazole compounds or halogenides of o-naphthoquinonediazide-4-sulfonic acid disclosed in J.P. KOKAI Nos. 54-74728, 55-77742 and 60-3626 as a free radical generator different from those represented by the general formula (I).

In the composition for forming resists according to the present invention, the amount of the compounds represented by general formula (I) falls within the range of from about 0.1 to about 10 parts by weight, preferably 0.3 to 3 parts by weight; that of the discoloring agent ranges from about 0.1 to about 10 parts by weight, preferably from 0.5 to 5 parts by weight; and further that of the o-naphthoquinonediazide compounds are in the range of about 10 to about 50 parts by weight, preferably 20 to 40 parts by weight, on the basis of 100 parts by weight of the total amount of the composition.

The composition for forming resists which thus acquire the intended printing out property are in general dispersed in a solvent before it is coated on a substrate or the like. Examples of such solvents include ethylene dichloride, dichloromethane, cyclohexanone, acetone, methyl ethyl ketone, ethyl acetate, methyl cellosolve acetate, ethyl cellosolve acetate, N,N-dimethylformamide, dimethyl sulfoxide, N,N-dimethylacetamide, acetyl acetone, propylene glycol monomethyl ether acetate, dioxane, tetrahydrofuran, gamma-butyrolactone, propylene glycol monoethyl ether, propylene glycol mono-n-propyl ether, propylene glycol mono-iso-propyl ether, propylene glycol monoacetate, propylene glycol and diacetone alcohol and these solvents may be used alone or in combination.

Particularly, the light-sensitive composition according to the present invention can effectively be used as the light-sensitive layer of PS plates for use in producing lithographic printing plates. In this respect, there may be mentioned such a substrate as metal plates (for instance, aluminum, aluminum alloys, zinc, iron and copper); and plastic materials which have been laminated with the foregoing metal film or sheet or onto which the films of such metals have been deposited. The most preferred is aluminum plate among others. In this connection, if a substrate having metal surface, in particular aluminum surface, is used, it is preferred to subject the surface thereof to surface treatment such as graining, immersion into an aqueous solution of sodium silicate, potassium fluorozirconate, phosphates or the like, or anodization.

Moreover, it is also suitable to use aluminum plate which has been grained and then immersed in an aqueous solution of sodium silicate as disclosed in U.S. Pat. No. 2,714,066 and aluminum plate which has been anodized followed by immersion in an aqueous solution of an alkali metal silicate as described in U.S. Pat. No. 3,181,461.

The foregoing anodization treatment is carried out by applying an electric current through the aluminum plate serving as the anode in an aqueous or non-aqueous solution of an inorganic acid such as phosphoric acid, chromic acid, sulfuric acid and boric acid; an organic acid such as oxalic acid and sulfamic acid; or a salt thereof; or a mixed solution thereof, in particular, an aqueous solution of phosphoric acid, sulfuric acid or the mixture thereof.

Furthermore, the silicate electrodeposition is also effective as the surface treatment of the aluminum plate as disclosed in U.S. Pat. No. 3,658,662. Preferred aluminum plate also includes one which has been electrolyzed in hydrochloric acid as an electrolyte with applying alternating current and then anodized in sulfuric acid as an electrolyte as described in British Patent No. 1,208,224. It is desirable to apply an underlying layer of cellulosic resin containing water-soluble salts of a metal such as zinc to the surface of the aluminum plate which has been anodized according to the foregoing process, in order to prevent the formation of scum during printing.

The amount of the light-sensitive composition coated on such a substrate ranges from about 0.1 to about 7 g/m², preferably 0.5 to 4 g/m².

The PS plate thus obtained is subjected to imagewise exposure to light followed by development with an alkali aqueous solution to remove exposed portions and thus a lithographic printing plate is obtained.

The light-sensitive composition according to the present invention may be used to form proof plates for printing, films for overhead projector and films for intermediate print. In this case, examples of suitable substrates therefor include transparent films such as polyethylene terephthalate film and cellulose triacetate film and these plastic films, the surface of which has been chemically or physically matted.

Furthermore, the light-sensitive composition of the present invention may also be used for manufacturing films for photomask and in such case, examples of preferred substrates are polyethylene terephthalate films onto which aluminum, alloy thereof of chromium has been deposited or polyetheylene terephthalate films to which a colored layer has been applied.

The free radical generator as used herein can be decomposed by the irradiation with light in a light-sensitive composition containing a light-sensitive resist-forming compound and permits the effective and rapid discoloration of the coexisting discoloring agent. As a result, it is possible to obtain a clear boundary between the exposed portions and the non-exposed portions and thus a high contrast is established therebetween, which leads to the formation of visible images clearly recognizable.

A variety of discoloring agents may be used in the composition of the present invention and therefore, if different kinds of additives are incorporated in the composition in order to improve the properties of the light-sensitive composition, a suitable discoloring agent compatible with these additives can freely be selected.

The free radical generators as used herein have a high stability with time and therefore, the shelf life of the final products such as PS plates in substantially improved.

The photolytic degradations reaction of the free radical generators as used herein is very rapid and is not almost inhibited by the coexisting light-sensitive resist-forming compound. This means that a desired effect is surely attained by the addition of only a small amount of the generator.

The free radical generators used in the present invention exert no influence on the photolysis of the light-sensitive resist-forming compound. Therefore, the sensitivity of the light-sensitive composition (the sensitivity of the resist) almost remains unchanged. Moreover, since in the composition of the present invention only a small amount of the free radical generator is required to achieve a desired effect as already mentioned above, the physical properties of images formed on the resist by irradiating it with light and then developing also remains unchanged. For example, if the light-sensitive composition which acquires the printing out property according to the present invention is used as the light-sensitive layer of a PS plate, properties of the PS plate or the resultant lithographic printing plates such as development property, hydrophobicity, background contamination, printing durability are almost equivalent to those observed when such a free radical generator is not added thereto at all.

The light-sensitive composition according to the present invention will hereunder be explained in more detail with reference to the following non-limitative working examples. IN the following EXAMPLES, —%— is expressed as —% by weigh—unless otherwise specified.

EXAMPLES 1 to 3 and COMPARATIVE EXAMPLES 1 to 3

The following coating liquid was applied to the surface of an aluminum plate of 0.24 mm in thickness which was previously grained and then anodized and the resultant layer was dried at 100° C. for 2 minutes.

| | | | |
|---|---|---|---|
| Esterification reaction product of naphthoquinone-(1,2)-diazide-(2)-5-sulfonyl chloride and cresol novolak resin | 0.75 g | | |
| Cresol novolak resin | 2.10 g | | |
| Tetrahydrophthalic acid anhydride | 0.15 g | | |
| Free radical generator (see Table I) | 0.03 g | | |
| Crystal Violet | 0.01 g | | |
| Oil Blue #603 (manufactured and sold by ORIENT CHEMICAL INDUSTRIES LTD.) | 0.01 g | | |
| Ethylene dichloride | 18 g | | |
| 2-Methoxyethylacetate | 12 g | | |

The coated amount of the liquid after drying was 2.1 g/m². These PS plates thus produced were exposed, through a positive transparency, to light from a metal halide lamp (2KW) disposed 1 m distant therefrom. In this respect, the reasonable exposure time was selected such that step 5 of a gray scale having an optical density difference of 0.15 became completely clear.

The optical densities of exposed and non-exposed portions of the light-sensitive layer were determined with Macbeth's reflection densitometer.

The greater the difference ($\Delta D$) between the optical densities of the exposed and non-exposed portions, the more distinct the images after exposure to light.

Moreover, the PS plates were exposed to light under the same conditions as mentioned before following by immersing in 4% aqueous solution of sodium metasilicate at 25° C. for 1 minute and water washing and then the reasonable exposure time as defined above was determined (the shorter the exposure time, the higher the sensitivity thereof).

In addition, the PS plates were exposed to light through a positive transparency under the same conditions as mentioned before followed by rubbing them with sponge containing 4% aqueous solution of sodium metasilicate to carry out the development and then the non-image areas were examined if there is uneven development (that due to development by hand labor). Results thus obtained are summarized in the following Table I.

In Table I, the uneven development due to the development by hand labor is estimated according to the following three stages evaluations:

(−) uneven development is not observed;
(+) uneven development is observed to some degree;
(++) uneven development is observed in great degree.

The compositions expressed by the ideograms (−) and (+) are practically acceptable.

TABLE 1

| Ex. No. | Free Radical Generator | Uneven Development | Reasonable Exposure Time (sec.) |
|---|---|---|---|
| 1* | — | (−) | 65 |
| 1 | Compound (1) | (−) | 69 |
| 2 | Compound (4) | (+) | 71 |
| 3 | Compound (5) | (−) | 70 |
| 2* | Compound (a) | (++) | 67 |
| 3* | Compound (b) | (++) | 72 |

| | Optical Density of the Light-sensitive Layer | | |
|---|---|---|---|
| Ex. No. | Non-exposed Portion | Exposed Portion | $\Delta D$ |
| 1* | 0.88 | 0.88 | 0.00 |
| 1 | 0.88 | 0.67 | 0.21 |
| 2 | 0.87 | 0.65 | 0.22 |
| 3 | 0.88 | 0.67 | 0.21 |
| 2* | 0.89 | 0.71 | 0.18 |
| 3* | 0.87 | 0.66 | 0.21 |

*COMPARATIVE EXAMPLE

Compound (a) is compound No. 7 disclosed in Table I of J. P. KOKAI No. 54-74728 and having the following formula:

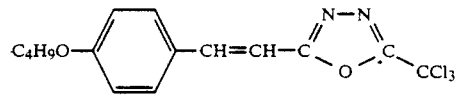

Compound (b) is the one disclosed in U.S. Pat. No. 3,954,475 and having the following formula:

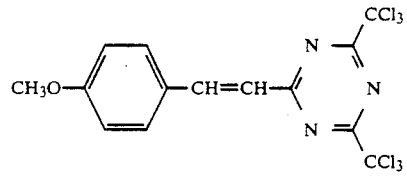

As seen from the results listed in Table I, it is clear that the composition of the present invention has distinct printing out property, maintains a high sensitivity and causes no uneven development when it is developed.

Moreover, when the PS plates were exposed to light according to the same procedures as before followed by water washing and coating with the protective gum comprised of a hydrophilic colloid and then was set up on a printing machine to carry out printing, clear printed matters having no background contamination were obtained with respect to all of the samples in EXAMPLES 1 to 3.

EXAMPLES 4 and COMPARATIVE EXAMPLES 4 to 5

The following coating liquid was applied to the surface of a substrate prepared according to the same procedures as those in EXAMPLES 1 to 3 and the coated layer was dried at 100° C. for 2 minutes. The coated amount thereof after drying was 1.5 g/m².

| | |
|---|---|
| Copolymer (a) | 0.31 g |
| Cresol-formaldehyde novolak resin | 1.0 g |
| Free radical generator (Table II) | 0.05 g |
| Oil Blue #603 (manufactured and sold by ORIENT CHEMICAL INDUSTRIES LTD.) | 0.01 g |
| Ethylene dichloride | 10 g |
| Methyl cellosolve | 10 g |

Copolymer (a):

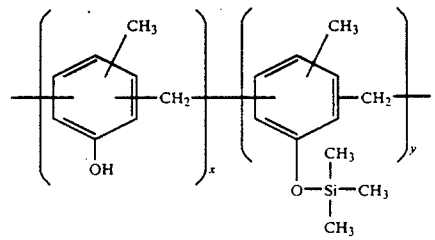

x/y = 70/30

The resultant products were subjected to the same exposure - development treatments as in EXAMPLES 1 to 3 and the same measurement was also carried out. Results thus obtained are summarized in the following Table II.

TABLE II

| Ex. No. | Free Radical Generator | Uneven Development | Reasonable Exposure Time (sec.) |
|---|---|---|---|
| 4 | Compound (1) | (−) | 40 |
| 4* | Compound (b) | (++) | 40 |
| 5* | Compound (c) | (−) | 45 |

| | Optical Density of the Light-sensitive Layer | | |
|---|---|---|---|
| Ex. No. | Non-exposed Portion | Exposed Portion | ΔD |
| 4 | 0.85 | 0.74 | 0.11 |
| 4* | 0.85 | 0.75 | 0.10 |
| 5* | 0.84 | 0.79 | 0.05 |

*COMPARATIVE EXAMPLE

Compound (c): 1,2-naphthoquinone-2-diazide-4-sulfonyl chloride

As seen from the results summarized in Table II, the light-sensitive composition of the present invention provides a presensitized plate free from uneven development due to the development by hand labor and having a rather high sensitivity.

What is claimed is:

1. A light-sensitive composition which comprises at least one light-sensitive free radical generator represented by the following general formula (I), at least one discoloring agent which interacts with products generated through the photolytic degradation of the light-sensitive free radical generator to change the color tone thereof and a positive light-sensitive component which has increased solubility in a developer after exposure to actinic light, wherein said positive light-sensitive component comprises an o-quinonediazide compound or a composition comprising a compound capable of generating an acid by the action of light and a compound having at least one bond capable of being cleaved with the acid:

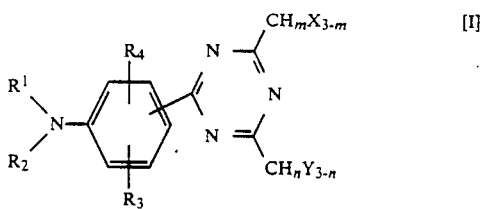

wherein $R_1$ and $R_2$ may be the same or different and represent hydrogen atom, a substituted or unsubstituted alkyl group, a substituted or unsubstituted aryl group, or a group represented by the following general formula (II) or (III):

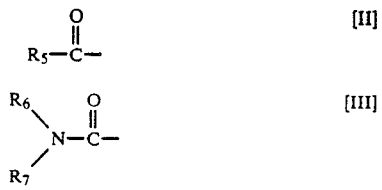

(in the general formula (II) or (III), $R_5$ represents a substituted or unsubstituted alkyl group, or a substituted or unsubstituted aryl group; and $R_6$ and $R_7$ may be the same or different and represent hydrogen atom, a substituted or unsubstituted alkyl group or a substituted or unsubstituted aryl group); or $R_1$ and $R_2$ may form a heterocyclic group consisting of non-metallic atoms together with the nitrogen atom to which they are bonded; $R_3$ and $R_4$ may be independently selected from a hydrogen atom, a halogen atom, an alkyl group of an alkoxy group; X and Y may be the same or different and represent chlorine atom or bromine atom; and m and n are an integer of 0, 1 or 2, wherein the light-sensitive free radical generator and the discoloring agent are in admixture, the light-sensitive free radical generator is present in an amount sufficient to change the color tone of the discoloring agent by the photolytic degradation products thereof, and the discoloring agent is present in an amount sufficient to impart a visible contrast between exposed and non-exposed portions of the light sensitive composition upon interaction with the photolytic degradation products of the free radical generator.

2. The light-sensitive composition as set forth in claim 1 wherein the substituted or unsubstituted alkyl group in $R_1$ to $R_7$ is a member selected from the group consisting of those having 1 to 6 carbon atoms and the substituted or unsubstituted aryl group thereof is a member selected from the group consisting of those having 6 to 14 carbon atoms.

3. The light-sensitive composition as set forth in claim 2 wherein the substituents of the substituted alkyl and aryl groups in $R_1$, $R_2$ and $R_5$ to $R_7$ are selected from the group consisting of aryl groups, halogen atoms, alkoxy groups, carboxyl group, carboalkoxy groups, carboaryloxy groups, cyano group, acyl groups, nitro group, dialkylamino groups, and groups derived from sulfonyl represented by the following general formulas $-SO_2-Z$, $-SO_2-O-Z$ and $-SO_2-NH-Z$ (wherein Z represents hydrogen atom, an alkyl group or an aryl group), and alkyl groups provided that $R_1$, $R_2$ or $R_5$ to $R_7$ is a substituted aryl group.

4. The light-sensitive composition as set forth in claim 3 wherein the substituents of the substituted alkyl or aryl group in $R_1$ and $R_2$ are selected from the group consisting of halogen atoms, carboxyl group, carboalkoxy groups, cyano group, acyl groups and the groups derived from sulfonyl and the substituents of the substituted alkyl or aryl group in $R_5$ are selected from the group consisting of dialkylamino groups and alkoxy groups.

5. The light-sensitive composition as set forth in claim 1 wherein the amount of the compound represented by the general formula (I) ranges from 0.01 to 100 parts by weight per 1 part by weight of the discoloring agent.

6. The light-sensitive composition as set forth in claim 5 wherein the discoloring agent is an aryl amine, a leuco dye, a diphenylmethane type dye, a triphenylmethane type dye, a thiazine type dye, an oxazine type dye, a xanthene type dye, an anthraquinone type dye, an iminonaphthoquinone type dye, an azomethine type dye or an azo type dye.

7. The light-sensitive composition as set forth in claim 6 wherein the substituted or unsubstituted alkyl group in $R_1$ to $R_7$ is a member selected from the group consisting of those having 1 to 6 carbon atoms and the substituted or unsubstituted aryl group thereof is a member selected from the group consisting of those having 6 to 14 carbon atoms and the heterocyclic group formed from $R_1$ and $R_2$ together with the nitrogen atom to which they are bonded is a group selected from the group consisting of those represented by the following formulas (D) to (H):

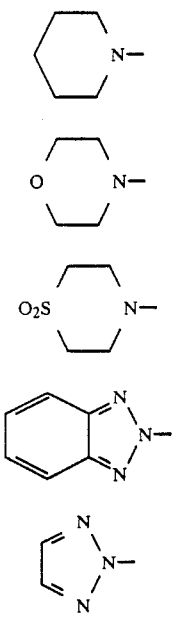

(D)
(E)
(F)
(G)
(H)

8. The light-sensitive composition as set forth in claim 1 wherein the positive light-sensitive component is a composition comprising an o-quinonediazide compound.

9. The light-sensitive composition as set forth in claim 8 wherein the o-quinonediazide compound is an o-naphthoquinonediazide compound.

10. The light-sensitive composition as set forth in claim 9 wherein the amount of the compound represented by the general formula (I) is about 0.1 to about 10 parts by weight, that of the discoloring agent is about 0.1 to about 10 parts by weight and that of the o-naphthoquinonediazide compound is about 10 to 50 parts by weight, on the basis of 100 parts by weight of the total amount of the composition.

11. The light-sensitive composition as set forth in claim 8 wherein the o-quinonediazide compound is used in combination with an alkali-soluble resin.

12. The light-sensitive composition as set forth in claim 11 wherein the amount of the alkali-soluble resin is in the range of from about 50 to about 85% by weight on the basis of the total weight of the o-quinonediazide compound and the alkali-soluble resin.

13. The light-sensitive composition as set forth in claim 12 wherein the amount of the alkali-soluble resin is in the range of from 60 to 80% by weight.

14. The light-sensitive composition as set forth in claim 1 wherein the positive light-sensitive component is a composition comprising a compound capable of generating an acid by the action of light and a compound having at least one bond capable of being cleaved with the acid.

15. The light-sensitive composition as set forth in claim 14 wherein the ratio of the compound capable of generating an acid to the compound having at least one bond capable of being cleaved with the acid falls within the range of 0.01:1 to 2:1.

16. The light-sensitive composition as set forth in claim 15 wherein the ratio is in the range of 0.2:1 to 1:1.

17. The light-sensitive composition as set forth in claim 14 wherein the positive light-sensitive component is used in combination with an alkali-soluble resin.

* * * * *